(12) United States Patent
Chiba et al.

(10) Patent No.: US 6,436,842 B2
(45) Date of Patent: Aug. 20, 2002

(54) SEMICONDUCTOR WAFER INCLUDING A DOT MARK OF A PECULIAR SHAPE AND METHOD OF FORMING THE DOT MARK

(75) Inventors: Teiichirou Chiba; Akira Mori, both of Kanagawa-ken (JP)

(73) Assignee: Komatsu, Limited, Tokyo (JP)

( * ) Notice: Subject to any disclaimer, the term of this patent is extended or adjusted under 35 U.S.C. 154(b) by 0 days.

(21) Appl. No.: 09/776,269

(22) Filed: Feb. 2, 2001

(30) Foreign Application Priority Data

Feb. 7, 2000 (JP) ........................................ 2000-029396

(51) Int. Cl.⁷ ...................... H01L 21/31; H01L 21/469
(52) U.S. Cl. .......................................... 438/758; 438/570
(58) Field of Search ...................... 438/99, 102, 143, 438/510, 569, 570, 623, 758, 784, 789, 790

(56) References Cited

U.S. PATENT DOCUMENTS 5,402,726 A * 4/1995 Levien

FOREIGN PATENT DOCUMENTS

| DE | 19956107 A1 | * | 5/2000 |
| JP | 2000042763 A | * | 2/2000 |
| JP | 11047321 | * | 9/2000 |

\* cited by examiner

*Primary Examiner*—Hoai V. Ho
*Assistant Examiner*—Phuc T. Dang
(74) *Attorney, Agent, or Firm*—Bell, Boyd & Lloyd LLC

(57) ABSTRACT

A fine protruded dot-like mark is formed on part of a semiconductor wafer surface. A growth layer is grown by epitaxial treatment on an entire surface of a semiconductor wafer including the dot mark so as to form a dot mark. During this growth process, the dot-like mark is changed into a polygon pyramid shape including a clear ridge line indicating the same azimuth of the crystal axis as that of the wafer. This ridge line is optically read out so that the azimuth of the crystal axis of the wafer can be specified. Therefore, it is possible to obtain a semiconductor wafer including a dot mark having a peculiar shape excellent in optical visibility and indicating the azimuth of the crystal axis and to provide a method of forming the dot mark.

6 Claims, 11 Drawing Sheets

62.50×62.50 [μm]

APPEARANCE CHANGES OF THE DOT OF A SQUARE 9μm×9μm

RIGHT AFTER MARKING

AFTER 1μm EPITAXIAL GROWTH

AFTER 5μm EPITAXIAL GROWTH

AFTER 10μm EPITAXIAL GROWTH

APPEARANCE CHANGES OF THE DOT OF A SQUARE 4μm×4

RIGHT AFTER MARKING

AFTER 1μm EPITAXIAL GROWTH

AFTER 5μm EPITAXIAL GROWTH

AFTER 10μm EPITAXIAL GROWTH

SHAPE CHANGES OF THE DOT OF A SQUARE 9μm×9μm

RIGHT AFTER MARKING

AFTER 1μm EPITAXIAL GROWTH

AFTER 5μm EPITAXIAL GROWTH

AFTER 10μm EPITAXIAL GROWTH

SHAPE CHANGES OF THE DOT OF A SQUARE 4μm×4μm

RIGHT AFTER MARKING

AFTER 1μm EPITAXIAL GROWTH

AFTER 5μm EPITAXIAL GROWTH

AFTER 10μm EPITAXIAL GROWTH

SEMICONDUCTOR WAFER INCLUDING A DOT MARK OF A PECULIAR SHAPE AND METHOD OF FORMING THE DOT MARK

BACKGROUND OF THE INVENTION

1. Field of the Invention

The present invention relates to a semiconductor wafer that includes a dot mark having a peculiar shape and formed on a part of the wafer. More particularly, it relates to a semiconductor wafer including a dot mark having a shape that is excellent in optical visibility and enables the azimuth of a crystal axis of the semiconductor wafer to be optically recognized. It also relates to a method of forming such a dot mark.

2. Description of the Related Art

Electric characteristic of silicon, which is a substrate material of a semiconductor integrated circuit, depends on the azimuth of a crystal axis thereof. Therefore, when a circuit is printed onto a silicon wafer, which is a substrate material of a general semiconductor, its circuit pattern has to be matched with the azimuth of a crystal axis of the material. Thus, conventionally, a mark indicating the azimuth of the crystal axis is made on the semiconductor wafer.

As a typical example of this mark, an orientation flat is formed by cutting out part of a disc-shaped semiconductor wafer along a chord of the semiconductor wafer, which is perpendicular to the azimuth of its crystal axis. Generally, such an orientation flat is applied to a semiconductor wafer 150 mm in diameter. Sometimes it is also applied to a wafer 200 mm in diameter. Recently, as the semiconductor wafer to be used has been enlarged (diameter: 200 mm or more), a V-shaped notch has been applied for a mark. The V-shaped notch is formed in part of a periphery of a semiconductor wafer such that the azimuth of its crystal axis is matched with a line connecting a vertex of the V-shaped notch with a center of the wafer. This is because a demand of the manufacturers who want to obtain as many semiconductors integrated circuits as possible by enlarging the semiconductor wafer. Furthermore, minute disparity in film-forming quality during formation of the circuits due to the orientation flat has significantly influenced upon the degree of integration.

However, the azimuth mark of the aforementioned notch can also make a disadvantageous influence upon the degree of integration. Furthermore, because the notch forms a minute space, dust such as contamination or the like tends to be accumulated in the notch. Therefore, considering such influence, there has been a trend that the azimuth of the crystal axis on the semiconductor wafer is indicated by marking with a laser marker, instead of the aforementioned markings. However, marking of the azimuth of the crystal axis by the laser marker has not been so standardized as the aforementioned marking technology because it accompanies change of the existing equipment and leads to an increase of production cost.

On the other hand, through a manufacturing process for a semiconductor wafer and a semiconductor device, a laser marker is often used for marking management information including ID information, processing history and electric characteristics on part of the semiconductor wafer surface. Therefore, if a mark formed by the laser marker only indicates the azimuth of the crystal axis of the semiconductor wafer directly, the azimuth of the crystal axis need not to be measured by preliminarily using an X ray. Further, the semiconductor wafer does not need to be cut out at all. Therefore, this method can satisfy both the demands of the wafer manufacturers and the semiconductor device manufacturers.

SUMMARY OF THE INVENTION

The present invention has been achieved in views of these circumstances. Specifically, an object of the present invention is to provide a semiconductor wafer having a single azimuth mark or plural azimuth marks, which is not affected by cutting out and enables the azimuth of a crystal axis to be recognized by the mark or marks, by means of combining improved laser marking technology with ordinary general processing technology. Furthermore, the present invention has an object to provide a method of forming a mark having such peculiar characteristics.

The inventors of the present invention proposed a dot mark having a peculiar shape, which is different from a conventional dot mark of a concave hole type dot mark formed by means of conventional laser marking technology, and a forming method thereof through Japanese Patent Application No. 10-334009. The dot mark according to the invention of this prior application is formed by marking a surface of a product to be marked by laser beam as an energy source. A center portion of each of the dot marks has a protruded portion which is protruded upward from the surface of the product to be marked. This is a very fine dot mark having a length of 1 to 15 $\mu$m along the marking surface, and a height of the protruded portion in a range of 0.01 to 5 $\mu$m. This dot mark has an optically excellent visibility in spite that it is such a very fine dot mark.

When the inventors formed a thin film on the mark forming surface of the semiconductor wafer which has the aforementioned dot mark with such a protruded portion by expitaxial growth, they found that its initial dot shape had changed to a different one. Then, the inventors repeated experiments by changing a length of the dot mark along the marking surface and changing a thickness of a single crystal by the aforementioned epitaxial growth. Consequently, it has been found that if the thickness of the grown crystal is within an appropriate range, the dot mark grows to a polygonal pyramid or truncated polygonal pyramid having clear ridge lines. Furthermore, when the inventors formed a single crystal by epitaxial growth after forming the plural dot marks on the surface of the semiconductor wafer, they found that the respective dot marks have the same shapes after their shapes are changed and further, the corresponding ridge lines are oriented in the same direction.

The inventors further considered that the ridge lines were somehow related to the azimuth of the crystal axis. Therefore, they measured the azimuth of the crystal axis in the semiconductor wafer after the epitaxial growth. Consequently, they found that the ridge lines coincide with the azimuth of the crystal axis completely. Although a cause of such a change of the dot mark shape is not proved, the epitaxial growth apparently grows a crystal having the same surface azimuth as that of a substrate surface on the single crystal substrate. Because characteristics such as atomic density differs depending on the surface azimuth of the substrate, the growth velocity has an anisotropy of the growth that differs depending on the surface azimuth.

Therefore, it can be considered that the velocity of the epitaxial growth at a minute point protruded from the surface of the substrate differs depending on the surface azimuth. Therefore, the minute point will grow to a polygonal pyramid having ridge line extending along the azimuth of the crystal axis. From this estimation, it can be considered that the dot mark formed on the semiconductor prior to the epitaxial growth does not always have to be formed by a laser marker but may be formed by chemical vapor deposition method or the like, which also makes it possible to form a dot mark having a protruded part from the dot mark forming surface.

The present invention has been based on the above described knowledge. According to a first aspect of the present invention, there is provided a semiconductor wafer including a dot mark protruded from a surface of a semiconductor wafer at an arbitrary position, wherein the dot mark has a shape that allows an azimuth of a crystal axis to be optically recognized.

Specifically, the dot mark having the aforementioned shape is formed at an arbitrary position of the semiconductor wafer so that the azimuth of the crystal axis can be recognized directly from the shape of the dot mark. Therefore, it is not necessary to form an orientation flat or a V-shaped notch especially after the azimuth of the crystal axis is measured. Thus, not only an apparatus for measuring the azimuth of the crystal axis becomes unnecessary, but also the cutting part can be eliminated, which makes it possible to efficiently obtain a number of integrated circuits.

Further, because the dot mark for indicating the azimuth of the crystal axis has no locally deformed portion due to the orientation flat and V-shaped notch, no dust is accumulated even through multiple steps processes, so that cleanness can be maintained.

Furthermore, according to the first aspect of the present invention, it is preferable that the dot mark includes a ridge line indicating the azimuth of the crystal axis. As described previously, the dot mark formed on the semiconductor wafer after the epitaxial growth has clear ridge lines, which are oriented along the azimuth of the crystal axis of the wafer. Therefore, the azimuth of the crystal axis can be recognized easily by specifying the azimuth of the ridge lines.

Still further, according to the first aspect of the present invention, the shape of the dot mark is specified. Namely, it is preferably a polygonal pyramid or a truncated polygonal pyramid each having polygonal faces. If the number of polygonal faces is even, a diagonal line passing a center of the mark is a straight line so that the azimuth of the crystal axis can be recognized easily. Further, the number of the polygonal faces is preferably six or less. Further, it is more preferable that it has four faces. In this case, the ridge lines are disposed in a cross shape, so that when plural dot marks are formed, the ridge lines are arranged on a straight line, thereby making it possible to recognize the azimuth of the crystal axis indicated by the straight lines. If the number of the polygonal faces is eight or more, the entire shape almost becomes a circle, which makes it difficult to specify the direction of the ridge lines and the azimuth of the crystal axis.

Still further, according to the first aspect of the present invention, it is preferable that the dot mark is formed on part of a peripheral face of the semiconductor wafer. Front and rear sides of the peripheral face of the semiconductor wafer are partially chamfered. These chamfered regions of the front and rear sides and a side face region between these chamfered regions are very minute. Further, these regions are least affected by an interference with a surrounding apparatus or by chemical polishing in a wafer production process or a semiconductor device production process. Particularly, the front and rear side chamfered regions are stable in configuration. Therefore, if the aforementioned dot mark can be formed in these regions, it is never eliminated even through many manufacturing processes, so that the azimuth of the crystal axis can be always recognized whenever necessary. In order to form a desired number of dot marks in the aforementioned regions, the dot marks themselves are required to be fine. In this respect, the dot mark forming technology of the aforementioned prior invention proposed by the inventors is very effective.

According to a second aspect of the present invention, there is provided a method of forming at least one dot mark having a peculiar shape, comprising steps of: forming a dot-like mark having an arbitrary shape protruded from a surface of a semiconductor wafer at a predetermined position of the semiconductor wafer; forming a thin film composed of a single crystal on an entire surface of the semiconductor wafer by epitaxial growth; and during the epitaxial growth, converting the dot-like mark into a polygonal pyramid shape or a truncated polygonal pyramid shape each having polygonal faces and including a ridge line indicating an azimuth of a crystal axis.

The dot-like mark, which is to be formed prior to the epitaxial growth, can be formed easily by means of the laser marker according to the prior invention proposed by the inventors. Alternatively, the dot-like mark having such a shape can be formed by other processing technology, such as chemical vapor growth method. Further, the aforementioned epitaxial growth method in the present invention can employ a conventionally well known technology and it does not have to be modified especially for the present invention.

Furthermore, according to the second aspect of the present invention, it is preferable that a maximum length of the dot-like mark parallel to the surface of the semiconductor wafer is 1–15 μm. Since the dot-like mark is so fine, a required number of the dot-like marks can be formed on a peripheral face of the wafer as described above. Further, this dot mark has an optically excellent visibility even after the epitaxial growth. Therefore, this can be used for various kinds of management information.

DESCRIPTION OF EMBODIMENTS

Hereinafter, embodiments of the present invention will be described in detail with reference to the accompanying drawings.

First, a preferred example of a laser marker to be used will be described simply based on the laser marker disclosed in the aforementioned prior invention as proposed by the present inventors. This laser marker serves to form dot-like protruded marks in part of a semiconductor wafer before epitaxial growth of the present invention.

Figure 1:
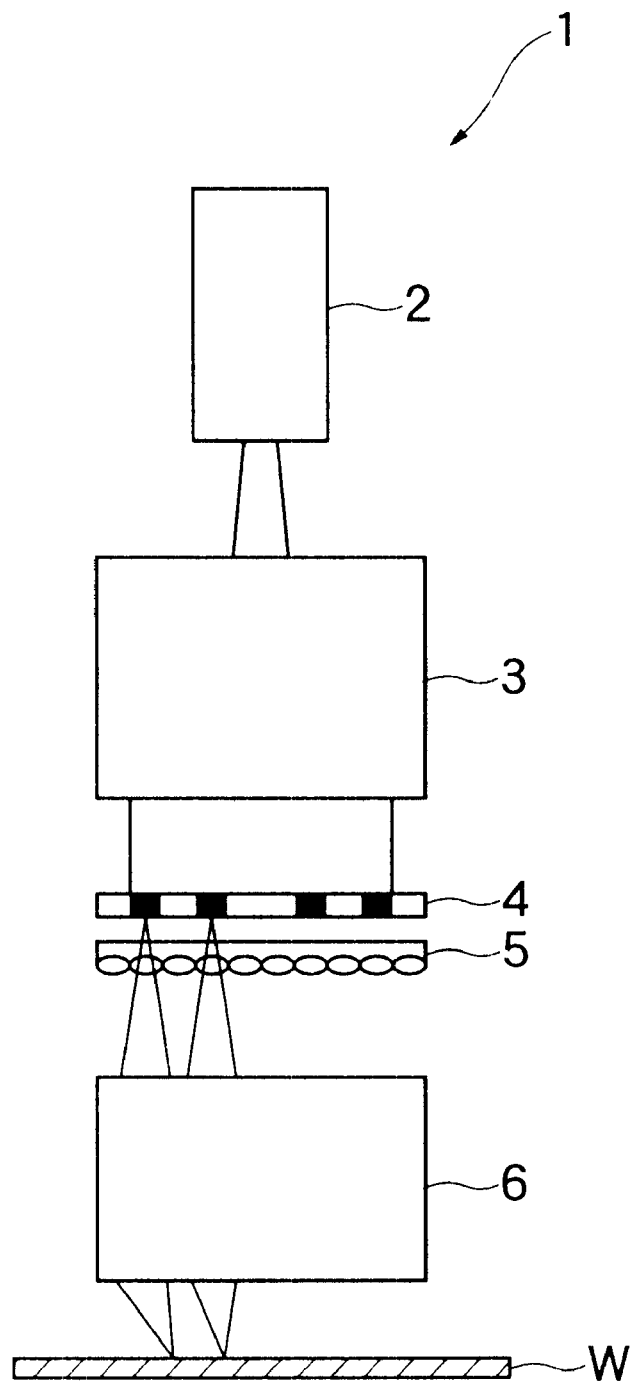
FIG. 1 is an explanatory diagram schematically showing an example of a laser marker for forming a dot-like mark M' having a peculiar shape according to the present invention.

Referring to FIG. 1, a laser marker 1 comprises a laser oscillator 2, a beam homonizer 3 for smoothing energy distribution of laser beam irradiated from the laser oscillator 2, a liquid crystal mask 4 which is driven so as to or not to allow the laser beam to transmit in accordance with a display of a pattern, a beam profile converter 5 for forming and converting energy density distribution of laser beam corresponding to each pixel of the liquid crystal mask 4 to a required distribution formation, and a lens unit 6 for imaging the beam having passed the liquid crystal mask 4 on a surface of a semiconductor wafer by the dot. A maximum length of a single dot on the liquid crystal mask 4 is 50 to 200 μm and a maximum length of a single dot by the lens unit 6 is 1 to 15 μm.

In the laser marker 1, laser beam having a Gaussian shaped energy density distribution, which is emitted from the laser oscillator 2, passed through the beam homonizer 3 so that it is formed to be top-hat type energy density distribution having substantially uniform peak values. After the energy density distribution is thus formed uniformly, the laser beam is irradiated onto the surface of the liquid crystal mask 4. At this time, as well known, the liquid crystal mask 4 is capable of driving and displaying a predetermined marking pattern on the mask. Consequently, the laser beam transmits pixel portions within the pattern display region, which are light-transmittable. The respective energy density distributions of the transmitted light after divided into respective pixels have the same shape as that formed by the beam homonizer 3 so that the energy density is distributed equally.

The beam homonizer 3 is a general term of an optical component for forming laser beam having energy density distribution of, for example, a Gaussian shape to be a smoothed energy density distribution shape. This optical component may apply, for example, a method of batch-irradiating laser beam onto a surface of the mask using fly eye lens, binary optics, or cylindrical lens, or a method of scanning the surface of the mask by driving a mirror by an actuator such as a polygonal mirror, a mirror scanner or the like.

According to the present invention, as previously described, the laser beam is controlled such that a pulse width of the laser beam is 10 to 500 ns and its energy density is 1.0 to 15.0 J/cm². Preferably, the energy density is 1.5 to 11.0 J/cm². When the laser beam is controlled within such a numerical value range, the aforementioned dot mark having a peculiar shape of the present invention can be formed.

According to this embodiment, a region of the liquid crystal mask 4 to be irradiated once is 10×11 dots. Although those dots are all irradiated by laser beam at one time, the number of the dots often does not meet a required number of dot marks. In such a case, it is permissible to divide a mark pattern into several sections, display these sections successively on the liquid mask and switch them, so that an entire mark pattern is formed on a surface of the wafer by combining those divided sections. In this case, it is necessary to control and move the wafer or an irradiation position when the laser beam is imaged on the surface of the wafer. For such control method, various methods, which are well known conventionally, can be applied.

The laser beam in dots having passing the liquid crystal mask 4 is irradiated to the beam profile converter 5. This beam profile converter 5 is arranged in a matrix so as to correspond to the individual liquid crystals disposed in a matrix in the liquid crystal mask 4. Therefore, the laser beam having transmitted the liquid crystal mask 4 passes the beam profile converter 5 dot by dot in one-to-one correspondence, so that the laser beam having smoothed energy density distribution by the beam homonizer 3 is converted to an energy density distribution required for forming a dot mark having a fine hole peculiar to the present invention. Although according to this embodiment, the laser beam having passed the liquid crystal mask 4 is made to pass the beam profile converter 5 so as to convert its energy density distribution, it is permissible to introduce the laser beam directly to the lens unit 6 without converting the profile of the energy density distribution by the beam profile converter 5.

The laser beam having passed the beam profile converter 5 is contracted by the lens unit 6 and irradiated to a predetermined position on the surface of a semiconductor wafer W, so that a necessary dot marking is made on that surface. According to the present invention, if a maximum length of a single pixel of the liquid crystal is 50 to 2000 μm, the pixel is contracted to 1 to 15 μm on the surface of the semiconductor wafer W by the lens unit 6. If this micro marking is intended to be made equally on the surfaces of the plural wafers, it is necessary to adjust a distance between the marking surface and the condensing lens as well as an optical axis thereof by the unit of micron. According to this embodiment, for detection of a focal point, a height is measured by a confocal method that is used generally in a laser microscope and then, its measurement result is fed back to a minute positioning mechanism in a vertical direction of the lens so that the focal point is automatically determined. Generally known methods are used for setting the optical axis and positioning and adjusting of optical components. For example, it is permissible to adjust them to a reference spot, which is preliminarily set, by a screw adjustment mechanism through a guide beam such as He—Ne laser. This adjustment only has to be carried out once during the assembly.

A fine dot-like mark M' according to this embodiment has a maximum length in a range of 1 to 15 μm, and a substantial height dimension in a range of 0.01 to 5 μm considering that a surrounding of its protruded portion is slightly dented. In order to form the dot-like mark M' having such dimensions, the length of one side of each dot of the liquid crystal mask 4 has to be 50 to 2000 μm so as not to cause a collapse in the image formation on an irradiated point on the surface of the semiconductor wafer W due to resolution or the like of a condensing lens unit. Further, if a distance between the beam profile converter 5 and the liquid crystal mask 4 is too large or too small, the laser beam tends to be affected by light in the surrounding or unstable condition of the optical axis so that the image formation on the surface of the semiconductor wafer tends to be disordered. Thus, according to this embodiment, a distance X between the beam profile converter 5 and the liquid crystal mask 4 is set to be 0 to 10 times a maximum length Y of each of the pixels of the liquid crystal mask 4. By setting the distance X within such a range, the image formation on the surface of the wafer becomes clear.

The aforementioned beam profile converter 5 is an optical component for converting the energy density distribution smoothed by the beam homonizer 3 into an optimum energy density distribution so as to obtain a dot shape peculiar to the present invention. This converter 5 serves to convert a profile of the energy density distribution of an incident laser beam into an arbitrary shape by making diffraction phenomenon, refraction phenomenon or arbitrarily varying light transmittance at a laser irradiation point. As the optical component, for example, a holographic optical element, a convex type micro lens array, or liquid crystals can be employed. These devices are disposed in a matrix so as to construct the beam profile converter 5.

Figure 2:
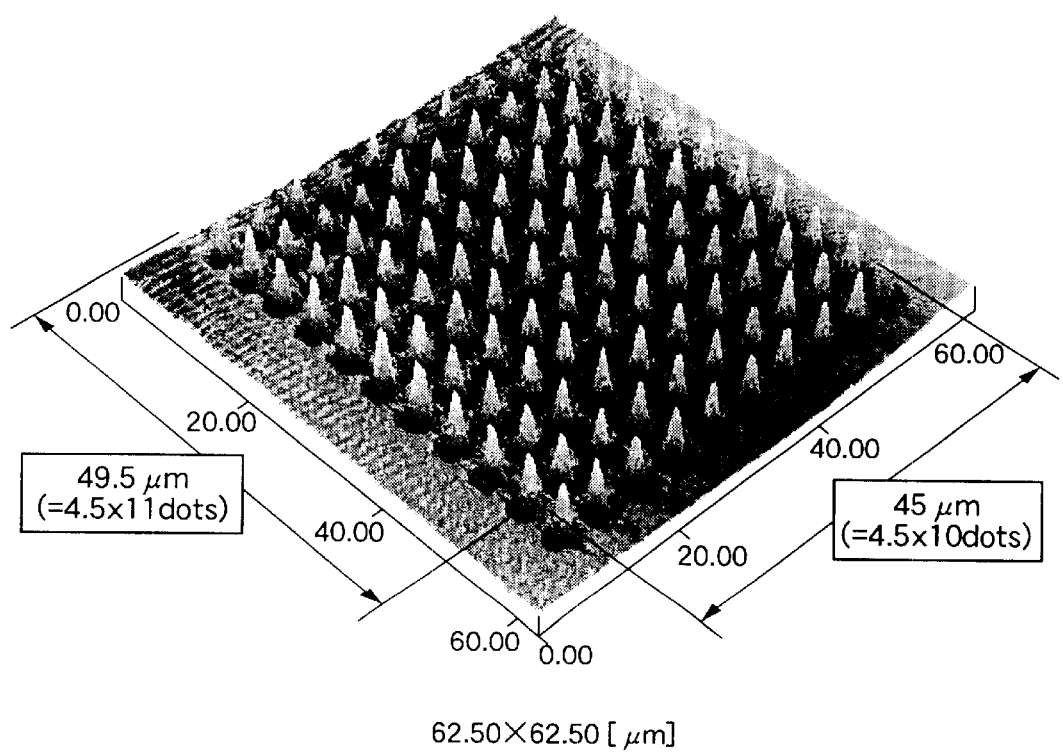
FIG. 2 is a three-dimensional view of typical dot-like marks M' formed by the aforementioned marker and arrangement thereof, as observed by AFM.
Figure 3:
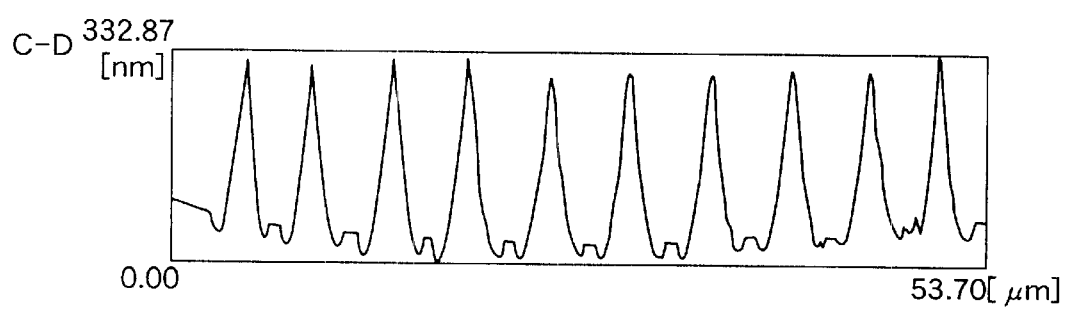
FIG. 3 is a sectional view of FIG. 2 as observed by the same AFM.

FIGS. 2 and 3 show a typical example of a shape and an arrangement of the dot marks formed according to the method of the present invention. FIG. 2 is a three-dimensional view observed by means of an AFM and FIG. 3 is a sectional view observed by the AFM. According to this embodiment, each dot-like mark M' imaged on the surface of the semiconductor wafer W is a square of 3.6 $\mu$m×3.6 $\mu$m and an interval between the respective dots is set to be 4.5 $\mu$m×4.5 $\mu$m. As understood from these Figures, substantially conical dot-like marks M' are formed on the surface of the semiconductor wafer W, each of which corresponds to each divided laser beam corresponding to each pixel of the liquid crystal mask 4. Further, the dot-like marks M' are arranged orderly in the formation of 11×10 and their heights are arranged substantially equally. This is because the energy distribution of laser beam irradiated to the liquid crystal mask 4 has been smoothed uniformly by the beam homonizer 3.

Figure 4:
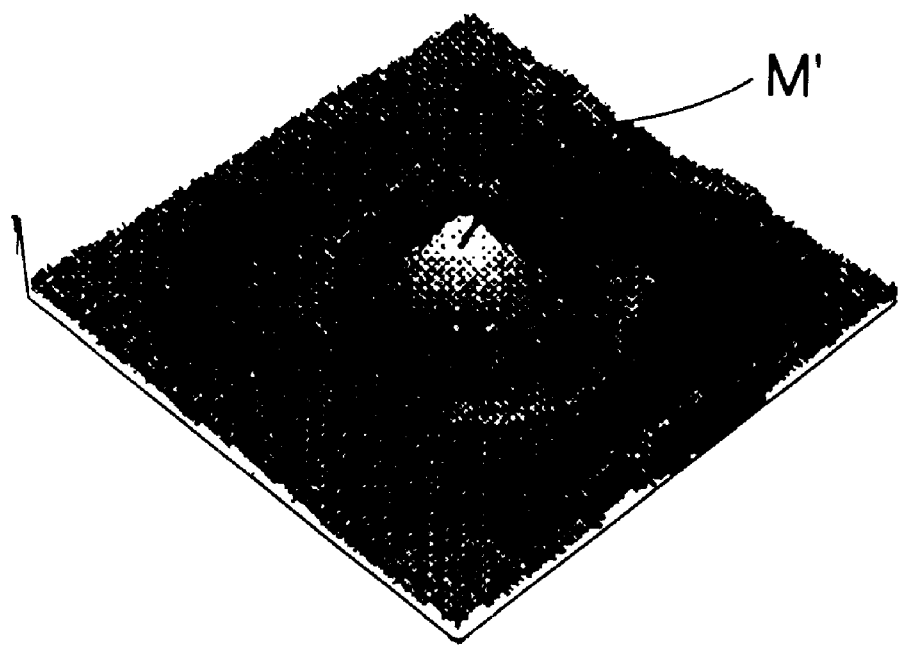
FIG. 4 is a three-dimensional view showing an example of the dot-like mark M' according to an embodiment of the present invention, as observed by the AFM.
Figure 5:
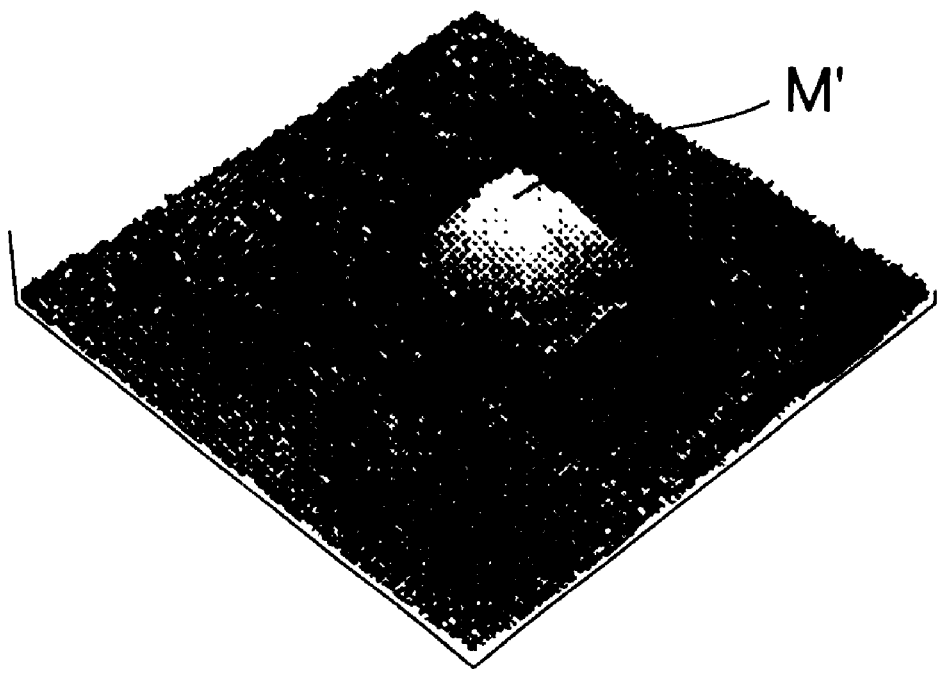
FIG. 5 is a three-dimensional view showing an example of the dot-like mark M' according to another embodiment of the present invention, as observed by the AFM.

FIGS. 4 and 5 respectively show a shape of the dot-like mark M' peculiar to the present invention, which is formed under a condition of the method of the present invention by the laser marker 1 employed in this embodiment, and a shape of a dot-like mark M' formed under another condition by the laser marker 1. The specification of the laser marker 1 is as follows:

| Laser medium: | Nd, YAG laser |
|---|---|
| Laser wavelength: | 532 nm |
| Mode: | TEM00 |
| Average output: | 4W @ 1 KHz |
| Pulse width: | 100 ns @ 1 KHz |

Although the wavelength of the laser beam here is 532 nm, it should not be limited to be so uniformly.

As a laser beam to be used in this embodiment, the second harmonic of a YAG laser oscillator or a YVO4 laser oscillator and a laser beam oscillated by titan sapphire laser oscillator or the like can be employed.

As shown in FIGS. 4 and 5, a shallow ring-like concave portion is formed around the dot-like mark M' and the center of the dot-like mark M' protrudes upward to form a substantially conical protruded portion. According to this dot shape, a portion having a very high luminance is formed on that protruded portion so that a difference of the luminance from the surrounding is increased. Consequently, a sufficient visibility can be secured. According to the dot-like mark shape prior to the epitaxial growth and the dot marking method of this embodiment, it is possible to form a single fine dot-like mark M' having a uniform shape of 3/20 to 1/100 as large as the conventional one accurately and neatly in a region for each of the dots on the surface of the semiconductor wafer. Furthermore, the dot-like mark M' has such a peculiar shape that its center portion is protruded unlike the conventional ones.

Thus, the dot-like mark M' of this embodiment is made to be fine to a larger extent than the conventional dot marks. Further, because a boundary between adjacent dot-like marks M' can be recognized clearly, a larger number of dot-like marks M' can be formed in the same region. Consequently, not only the marking region is increased largely, but also options of such a marking region are increased.

According to the present invention, after the dot-like mark M' is thus formed on the surface of the semiconductor wafer by the above described method, a crystal layer composed of a new single crystal is formed on the wafer surface including the same mark by epitaxial growth.

According to this embodiment, the dot-like mark shape prior to the aforementioned epitaxial growth is obtained by imaging an optical image of the respective squares 9 $\mu$m×9 $\mu$m and 4 $\mu$m×4 $\mu$m by the laser beam on the surface of the semiconductor wafer composed of Si single crystal. As understood from FIGS. 6A and 7D, the obtained protruded dot-like mark shape is not a pyramid but just a circular cone, which shows that it is not always analogous to an optical image by laser beam in a plan view. Further, according to this embodiment, difference of the dot shapes are compared with each other when the crystal layer formed by the epitaxial growth have thickness of 1 $\mu$m, 5 $\mu$m and 10 $\mu$m respectively.

For the epitaxial growth according to this embodiment, chemical vapor phase growth method is employed. According to this epitaxial growth, generally, a wafer is placed on a SiC coat carbon pedestal, which is a heating body, and then, it is put in a growth furnace. Then, the wafer is heated in an atmosphere of hydrogen under a high temperature of about 1000 to 1200° C. according to high frequency method, resistance heating method or lamp heating method. After that, the surface of the wafer is gas etched in depth of 0.1 to 0.4 $\mu$m by hydrogen diluted chlorine or sulfur hexafluoride gas so that a clean silicon surface is exposed.

After this gas etching is completed, mixed gas composed of reactive gas such as mono-silane gas or dopant gas is fed into a furnace so that silicon single crystal is epitaxial grown on the surface of the wafer. At this time, the thickness of the epitaxially grown layer is determined by the growth time. It is determined by concentration, flow rate, flow velocity, temperature, pressure and the like of reactive gas. Therefore, the thickness and the time of the growth are determined after those relations are accurately recognized.

Figure 6A:
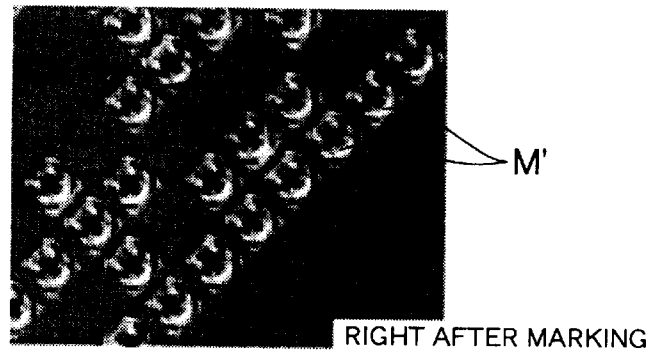
FIGS. 6A through 6D are plan views for showing changes of the shape of the dot-like mark shown in FIG. 4 to that after the epitaxial growth, as observed by the AFM.
Figure 6B:
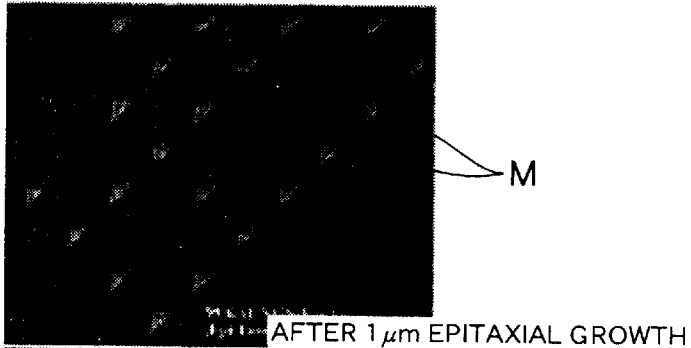
Figure 6C:
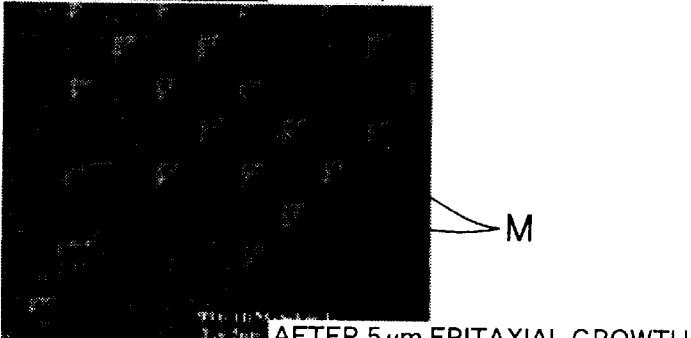
Figure 6D:
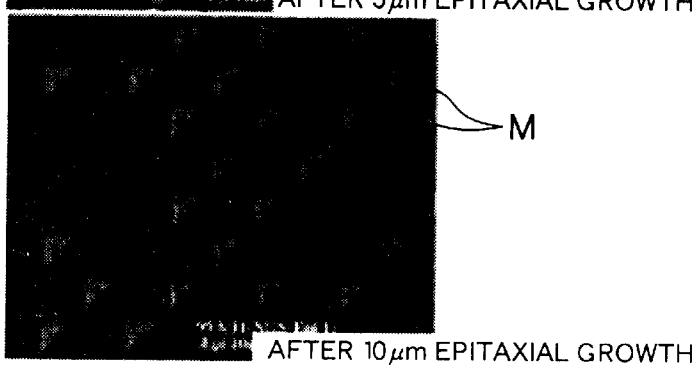
Figure 7A:
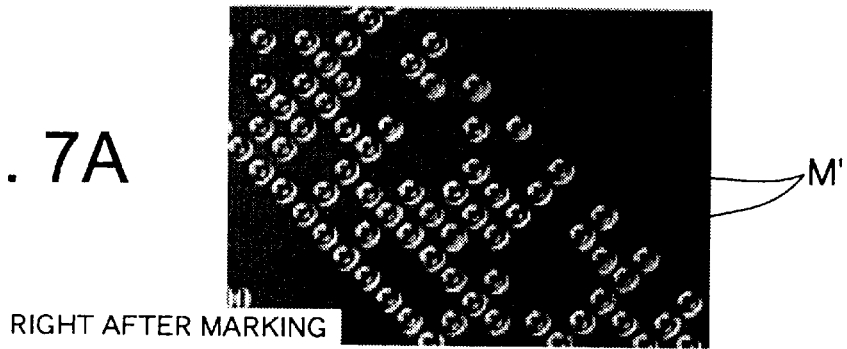
FIGS. 7A through 7D are plan views for showing changes of the shape of the dot-like mark shown in FIG. 5 to that after the epitaxial growth, as observed by the AFM.
Figure 7B:
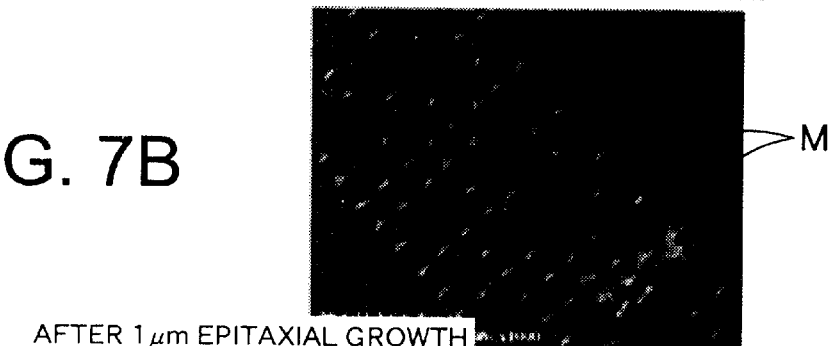
Figure 7C:
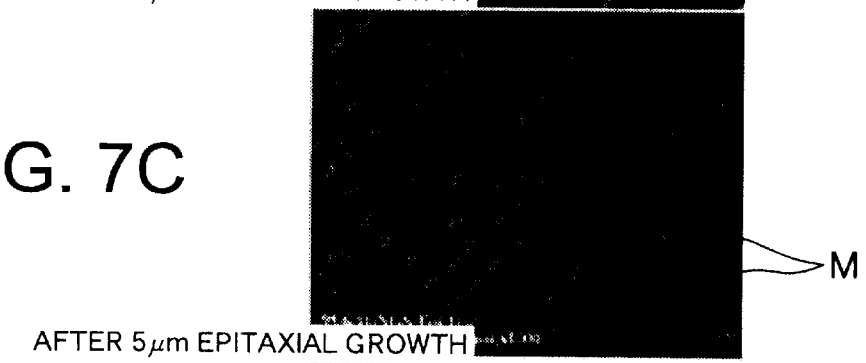
Figure 7D:
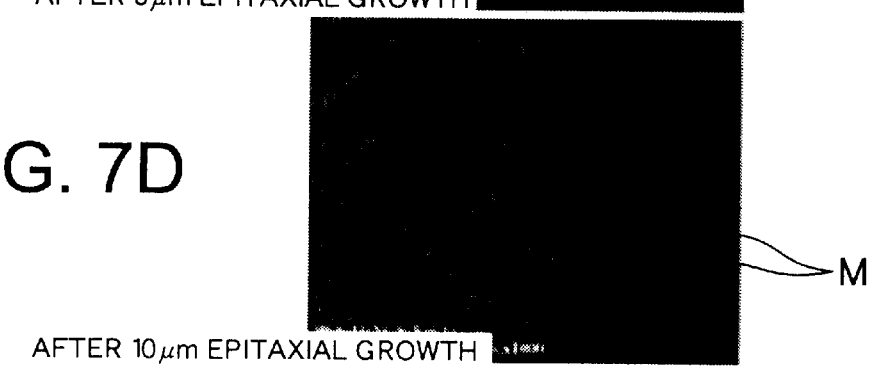
Figure 8A:
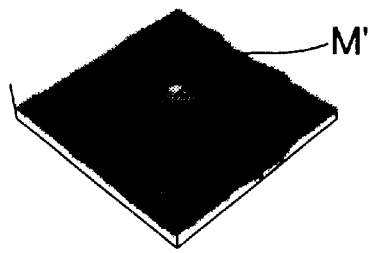
FIGS. 8A through 8D are three-dimensional views of enlarged marks corresponding to FIG. 6.
Figure 8B:
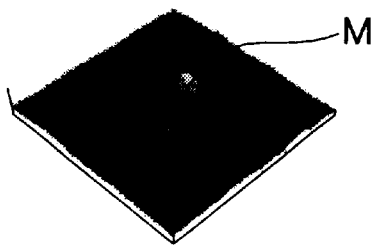
Figure 8C:
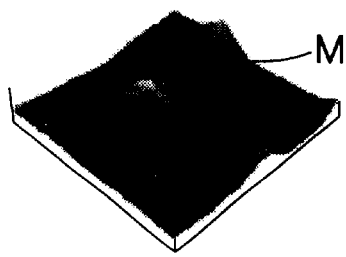
Figure 8D:
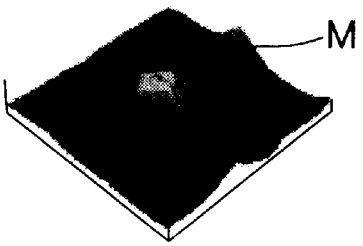
Figure 9A:
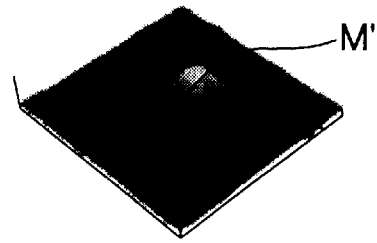
FIGS. 9A through 9D are three-dimensional views of enlarged marks corresponding to FIG. 7.
Figure 9B:
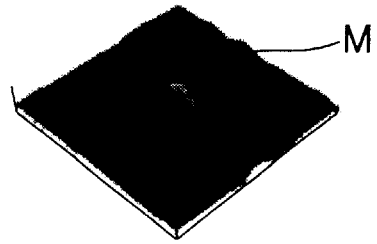
Figure 9C:
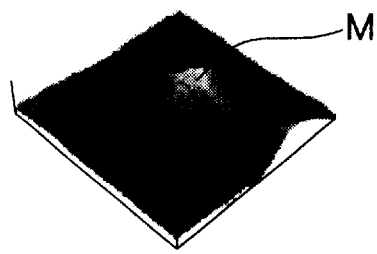
Figure 9D:
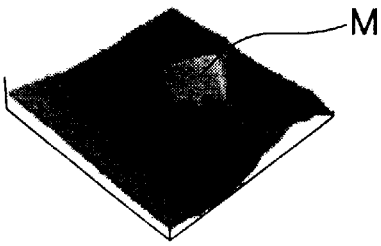

FIGS. 6A and 7A show the shapes of the dot-like marks M' formed by the laser marker prior to the epitaxial growth, in which each center portion is protruded on the surface of the semiconductor wafer. FIGS. 6B to 6D and 7B to 7D respectively show the dot mark shapes of the invention in plan views, which are formed on the surface of the semiconductor wafer having the dot-like marks M' shown in FIGS. 6A and 7A when the growth layer is formed by epitaxial growth so as to have a thickness of 1 $\mu$m, 5 $\mu$m and 10 $\mu$m respectively. FIGS. 8A to 8D and FIGS. 9A to 9D are enlarged perspective views of the dot marks of FIGS. 6A to 6D and FIGS. 7A to 7D.

As evident from these diagrams, it is understood that the grown layer by the epitaxial growth is changed such that a vertex of the dot mark M becomes a smooth surface with an increase of the thickness of the grown layer, irrespective of the size of the dot-like mark M' initially formed on the surface of the semiconductor wafer. More specifically, the dot mark M has a pyramid shape of a complete square when the thickness of the epitaxial growth layer is 1 to 5 $\mu$m, so that ridge lines extending from the vertex of the dot mark M in a cross shape are clear. If the thickness of the growth layer is 5 to 10 μm, however, the aforementioned pyramid shape is changed to a truncated pyramid having a flat top portion, instead of the aforementioned pyramid shape. Further, the smaller the size of the dot-like mark M' is formed initially, the more the top portion of the pyramid is truncated, so that its resultant shape becomes almost a simple cube of a small height.

Although in the shown example, a silicon wafer in which the azimuth of its crystal axis is <100> is used and the dot mark shape after the epitaxial growth is a pyramid or a truncated pyramid as described previously, the azimuth of the crystal axis on a generally used wafer is often <111>. Even with this azimuth, the dot mark after the epitaxial growth provides a polygonal pyramid having or a truncated polygonal pyramid having ridge lines. Therefore, this azimuth of the crystal axis can be specified by the ridge lines as the azimuth of the crystal axis of <100>.

Figure 10:
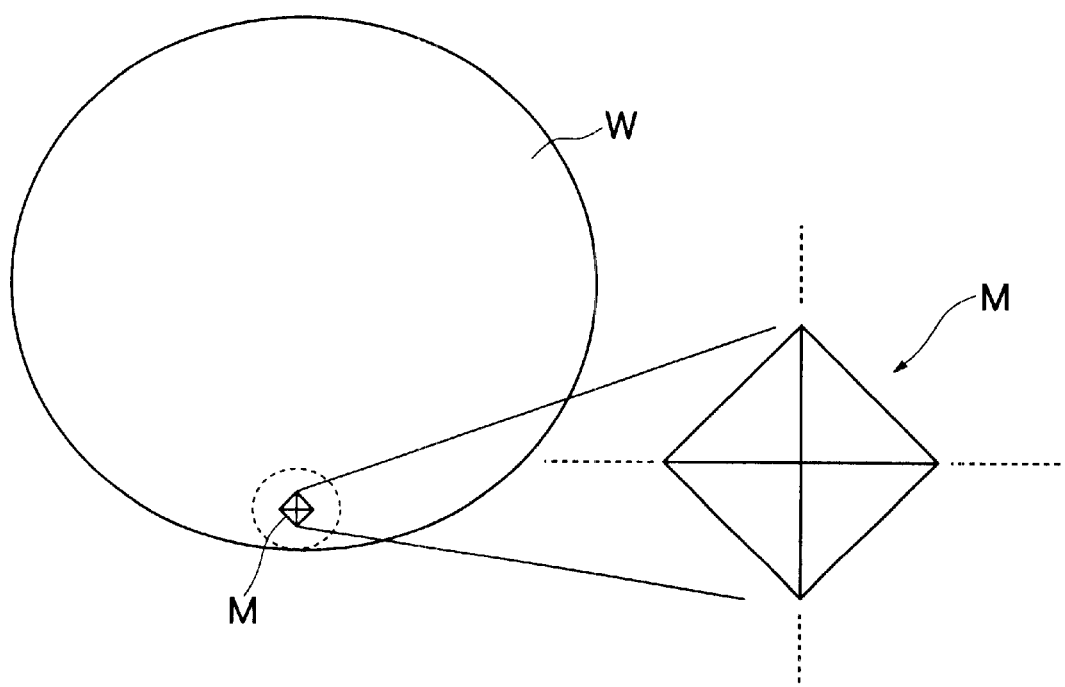
FIG. 10 is an explanatory diagram showing a method for determining the azimuth of a crystal axis from the dot mark shape according to the present invention.
Figure 11:
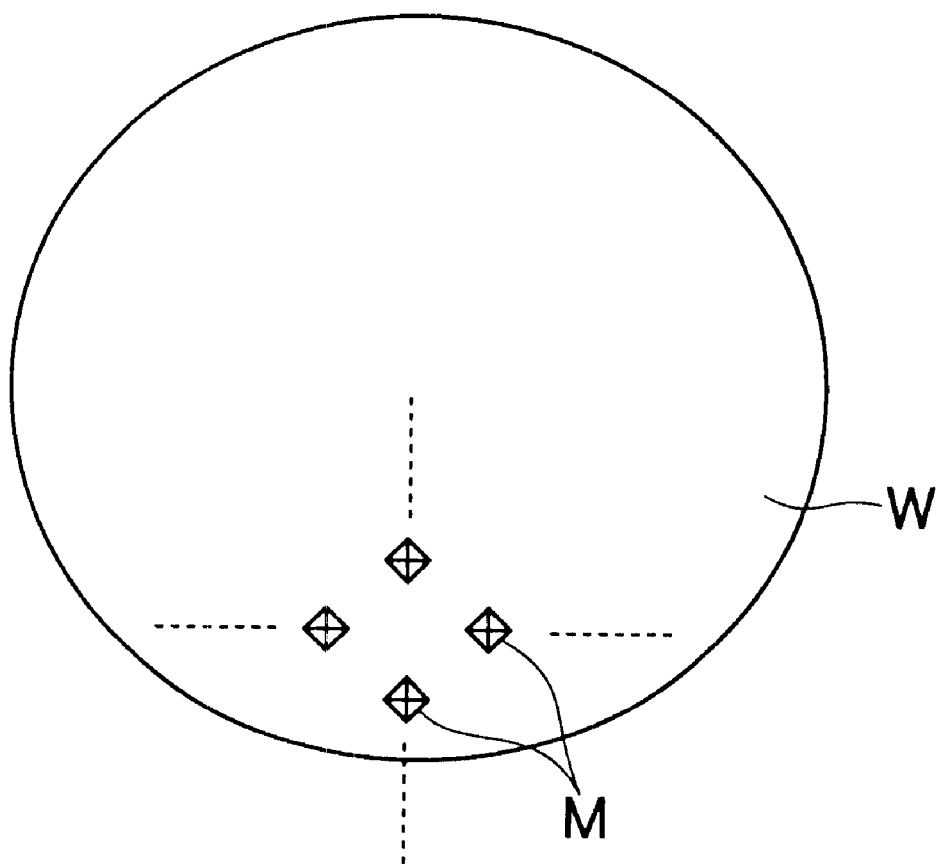
FIG. 11 is an explanatory diagram showing another method of determining the azimuth of a crystal axis from the dot mark shape according to the present invention.

In any way, what should be noted here is that the direction of the ridge lines of all the dot marks M formed on the same wafer surface are the same. Therefore, as described above, the extension of the ridge lines coincides with the azimuth of the crystal axis of the semiconductor wafer. FIGS. 10 and 11 are explanatory diagrams showing a method of determining the azimuth of the crystal axis of the wafer by using such phenomenon.

That is, as shown in FIG. 10, a single protruded dot-like mark M' is formed near a peripheral face of the surface of the semiconductor wafer by the aforementioned laser marker. Then, epitaxial treatment is carried out on the entire surface of the semiconductor wafer including that formed single protruded dot-like mark M' so that a grown crystal layer is formed. The ridge lines, which are optically clearly recognizable, are formed on the dot mark M whose shape has been changed by formation of this grown crystal layer as described before. The azimuth of the ridge lines directly indicates the azimuth of the crystal axis.

According to a method of determining the azimuth as shown in FIG. 11, first, two protruded dot-like marks M' are formed near a peripheral face of the surface of the semiconductor wafer along a diameter of the semiconductor wafer and three protruded dot-like marks M' are formed linearly perpendicularly to the diameter under the same processing condition by the aforementioned laser marker. Next, expitaxial treatment is carried out on the entire surface of the semiconductor wafer including the four protruded dot-like marks M' so that the grown crystal layer is formed. The ridge lines, which are optically clearly recognizable, are formed on the four dot marks M whose shapes have been changed by formation of the growth crystal layer. A linear direction connecting the ridge lines of the two dot marks M arranged in the diameter direction and a linear direction connecting the ridge lines of the two dot marks disposed perpendicularly to that diameter respectively indicate the azimuth of the crystal axis. When the azimuth of the crystal axis is determined by such plural dot marks M, an azimuth can be obtained with a higher precision than the azimuth determined by a single dot mark M.

In the above-described example, the dot marks M are formed on the surface of the wafer subjected to mirror treatment. The dot mark having a fine shape has an excellent visibility as evident from FIGS. 6 and 7. Therefore, when the dot mark M is formed on a peripheral face of the wafer less affected by various film forming treatment or circuit forming treatment, the dot mark can be used effectively not only for determining the azimuth of the crystal axis, but also for wafer management information as the conventional ones.

What is claimed:

1. A semiconductor wafer including a dot mark protruded from a surface of a semiconductor wafer at an arbitrary position, wherein said dot mark has a shape that allows an azimuth of a crystal axis to be optically recognized.

2. A semiconductor wafer according to claim 1, wherein said dot mark includes a ridge line indicating the azimuth of the crystal axis.

3. A semiconductor wafer according to claim 2, wherein the shape of said dot mark is either of a polygonal pyramid or a truncated polygonal pyramid each having polygonal faces.

4. A semiconductor wafer according to any one of claims 1 to 3, wherein said dot mark is formed on part of a peripheral face of the semiconductor wafer.

5. A method of forming at least one dot mark having a peculiar shape, comprising steps of:

forming a dot-like mark having an arbitrary shape protruded from a surface of a semiconductor wafer at a predetermined position of the semiconductor wafer;

forming a thin film composed of a single crystal on an entire surface of said semiconductor wafer by epitaxial growth; and during said epitaxial growth, converting said dot-like mark into either of a polygonal pyramid shape or a truncated polygonal pyramid shape each having polygonal faces and including a ridge line indicating an azimuth of a crystal axis.

6. A method according to claim 5, wherein a maximum length of the dot-like mark parallel to the surface of the semiconductor wafer is 1 to 15 μm.

* * * * *